United States Patent
Lee et al.

(10) Patent No.: US 7,656,045 B2
(45) Date of Patent: Feb. 2, 2010

(54) CAP LAYER FOR AN ALUMINUM COPPER BOND PAD

(75) Inventors: Chu-Chung Lee, Round Rock, TX (US); Kevin J. Hess, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 510 days.

(21) Appl. No.: 11/360,336

(22) Filed: Feb. 23, 2006

(65) Prior Publication Data

US 2007/0194460 A1    Aug. 23, 2007

(51) Int. Cl.
*H01L 29/40* (2006.01)
*H01L 21/44* (2006.01)
*H01L 21/4763* (2006.01)

(52) U.S. Cl. .................. 257/784; 257/459; 257/758; 257/E23.02; 257/E23.033; 438/612; 438/617; 438/622; 438/650; 438/686

(58) Field of Classification Search .................. None
See application file for complete search history.

(56) References Cited

U.S. PATENT DOCUMENTS

| | | | |
|---|---|---|---|
| 5,019,891 A | 5/1991 | Onuki et al. | |
| 5,192,374 A | 3/1993 | Kindler | |
| 5,346,858 A | 9/1994 | Thomas et al. | |
| 5,380,401 A | 1/1995 | Jones et al. | |
| 5,461,008 A | 10/1995 | Sutherland et al. | |
| 5,907,790 A | 5/1999 | Kellam | |
| 5,942,448 A | 8/1999 | White | |
| 6,011,305 A * | 1/2000 | Suzuki et al. | 257/738 |
| 6,376,353 B1 * | 4/2002 | Zhou et al. | 438/612 |
| 6,376,363 B1 | 4/2002 | Iguchi | |
| 6,413,576 B1 | 7/2002 | Ellis et al. | |
| 6,435,398 B2 * | 8/2002 | Hartfield et al. | 228/103 |
| 6,452,271 B2 | 9/2002 | Jiang et al. | |
| 6,709,965 B1 | 3/2004 | Chen et al. | |
| 6,779,711 B2 * | 8/2004 | Edelstein et al. | 228/180.1 |
| 7,183,656 B2 * | 2/2007 | Luce et al. | 257/780 |
| 7,220,663 B2 * | 5/2007 | Chopra et al. | 438/612 |
| 7,262,126 B2 * | 8/2007 | Bojkov et al. | 438/618 |

(Continued)

FOREIGN PATENT DOCUMENTS

JP          362216339     *  9/1987

(Continued)

OTHER PUBLICATIONS

PCT/US07/60845 International Search Report and Written Opinion mailed Aug. 26, 2008.

*Primary Examiner*—Matthew C Landau
*Assistant Examiner*—James M Mitchell
(74) *Attorney, Agent, or Firm*—Robert L. King; David G. Dolezal

(57) ABSTRACT

A bond pad for an electronic device such as an integrated circuit makes electrical connection to an underlying device via an interconnect layer. The bond pad has a first layer of a material that is aluminum and copper and a second layer, over the first layer, of a second material that is aluminum and is essentially free of copper. The second layer functions as a cap to the first layer for preventing copper in the first layer from being corroded by residual chemical elements. A wire such as a gold wire may be bonded to the second layer of the bond pad.

18 Claims, 2 Drawing Sheets

U.S. PATENT DOCUMENTS

| | | | |
|---|---|---|---|
| 7,338,889 B2 * | 3/2008 | Akram | 438/612 |
| 7,459,387 B2 * | 12/2008 | Tiziani et al. | 438/614 |
| 2002/0027289 A1 * | 3/2002 | Kurihara et al. | 257/765 |
| 2004/0159951 A1 * | 8/2004 | Toyoda et al. | 257/762 |
| 2004/0183197 A1 * | 9/2004 | Matsuoka et al. | 257/758 |
| 2005/0104207 A1 | 5/2005 | Dean et al. | |
| 2005/0112794 A1 | 5/2005 | Cole et al. | |
| 2006/0186553 A1 * | 8/2006 | Ohta et al. | 257/781 |
| 2007/0015300 A1 * | 1/2007 | Liu et al. | 438/26 |
| 2007/0243665 A1 * | 10/2007 | Abbott et al. | 438/123 |

FOREIGN PATENT DOCUMENTS

| | | | |
|---|---|---|---|
| JP | 401298743 | * | 12/1989 |
| JP | 402063126 | * | 3/1990 |

* cited by examiner

CAP LAYER FOR AN ALUMINUM COPPER BOND PAD

FIELD OF THE INVENTION

This invention relates generally to semiconductor devices, and more specifically, to electrical interconnect structures within semiconductor devices.

BACKGROUND OF THE INVENTION

Semiconductors have scores of electrical interconnections required to make electrical contact between the various circuit components. A common electrical interconnect is known as a bond pad. A bond pad is an interconnect from the electrical integrated circuit to a point external to the integrated circuit. Typical bond pads are formed of an aluminum alloy containing a small percentage of copper. The semiconductor process which is used to form an opening in the semiconductor device to form the bond pad typically leaves residual chemicals on the surface of the bond pad location. One of the residual chemicals is fluorine (F). Subsequent formation of the bond pad results in the copper and aluminum used in the bond pad reacting in a fluorine environment. This reaction typically results in localized corrosion of the bond pad. For example, the bond pad may develop pits or holes and negatively affect the subsequent processing of the semiconductor device. For example, the increase in surface roughness of the bond pad results in less reliable adhesion of subsequent ball bond contact to the bond pad. The non-stick phenomena on the bond pad results in yield loss from the wire bonding process.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
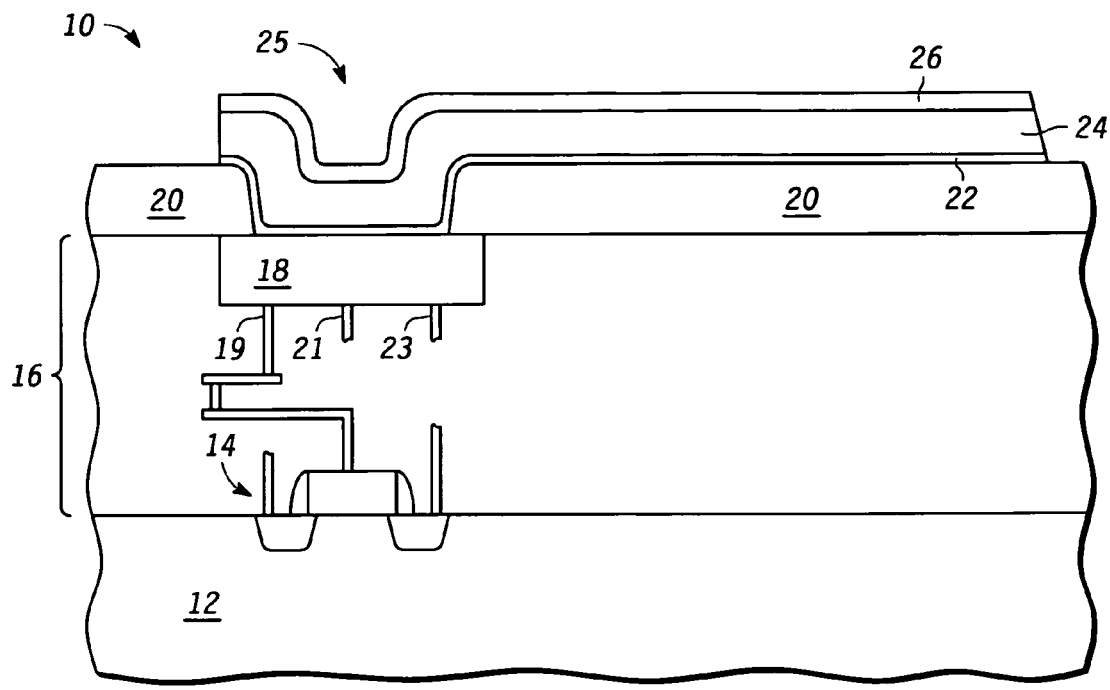
FIG. 1 illustrates in cross-sectional form a bond pad structure in accordance with one form of the present invention.

Illustrated in FIG. 1 is a semiconductor device 10 having a substrate 12. In one form the substrate 12 is formed of silicon, germanium or suitable III-V compound materials, such as germanium arsenide (GaA) may be used. Within and above the substrate 12 is formed one or more active devices such as transistor 14. Transistor 14 is a conventional transistor structure formed using a conventional process and therefore will not be discussed in detail. Overlying the substrate 12 is one or more interconnect layers 16. In one form the interconnect layers 16 are formed of an insulating material, such as oxide, and have a plurality of vias routed through them to make connection to the substrate 12. For example, vias such as via 19, via 21 and via 23 exist within the one or more interconnect layers 16. Via 19 makes electrical contact to the gate of transistor 14 by being routed through the one or more interconnect layers 16 in a non-linear path. At the top of the one or more interconnect layers 16 is formed a final metal portion 18 which make contact to the vias 19, 21 and 23. The final metal portion 18 is formed of copper. The copper that is used for the final metal portion 18 is as pure as possible. It is formed, in one form, by plating and then using a chemical mechanical polish (CMP) process to planarize the upper surface of the final metal portion 18 with the upper surface of the one or more interconnect layers 16. As shown in FIG. 1, all of transistor 14 is underlying the final metal portion 18 in a lateral direction. Overlying the one or more interconnect layers 16 is a patterned or etched passivation layer 20. The passivation layer 20 is patterned or etched to expose a portion but not all of the upper surface of the final metal portion 18. The passivation layer 20 may be formed of either oxide or nitride and has an opening which exposes the final metal portion 18. Formed overlying the final metal portion 18 and along the exposed sidewalls of the passivation layer 20 is a barrier layer 22. The barrier layer 22, in one form, is formed of one of the following conductive materials: tantalum or titanium. Additionally, a bi-layer structure may be used for barrier layer 22. In a bi-layer implementation, the materials tantalum and tantalum nitride or titanium and titanium nitride are used for the barrier layer 22. The barrier layer 22 is formed by selective deposition of the material that is chosen. The barrier layer 22 functions to protect the underlying final metal portion 18 or copper from diffusing into any overlying materials that are subsequently formed. The dimensions of the barrier layer 22 are not critical and may vary depending upon the specific application. For example, the length of the barrier layer 22 may extend laterally as illustrated in FIG. 1. The thickness is process dependent and is typically less than five hundred Angstroms.

Overlying the barrier layer 22 is formed a bond pad layer 24. The bond pad layer 24 is formed of aluminum and copper wherein the copper is less than one percent. In one form the percentage of the copper is one-half (0.5) percent. It should be understood that with the barrier layer 22 separating the bond pad layer 24 and the final metal portion 18 there is no migration of copper from the final metal portion 18 into the bond pad layer 24. Overlying the bond pad layer 24 is a cap layer 26. In one form the cap layer 26 is pure aluminum or an aluminum alloy. As used herein the term "pure aluminum" means a material that is at least 98 percent aluminum. In one form a pure aluminum cap layer 26 having 99.9 percent (99.9%) aluminum is desired. When an aluminum alloy is used pure aluminum is combined with one of the following metals: palladium (Pd), nickel (Ni), gold (Au), platinum (Pt), ruthenium (Ru), rhodium (Rh), iridium (Ir), cerium (Ce) and molybdenum (Mo). The resulting metallic interconnect creates a bond pad 25. The function of the cap layer 26 is to provide a smooth surface for wire bonding or bump contacting. It should be noted that the use of the cap layer 26 in combination with the bond pad layer 24 permits a wire bond to be formed to a metal surface that is not pitted or otherwise corroded. The upper metallic surface that is used for making a wire bond contact is free of copper. Therefore, chemicals that are used in semiconductor processing and which react with copper-aluminum alloy have no ability to negatively affect the bonding surface of this disclosed structure.

Figure 2:
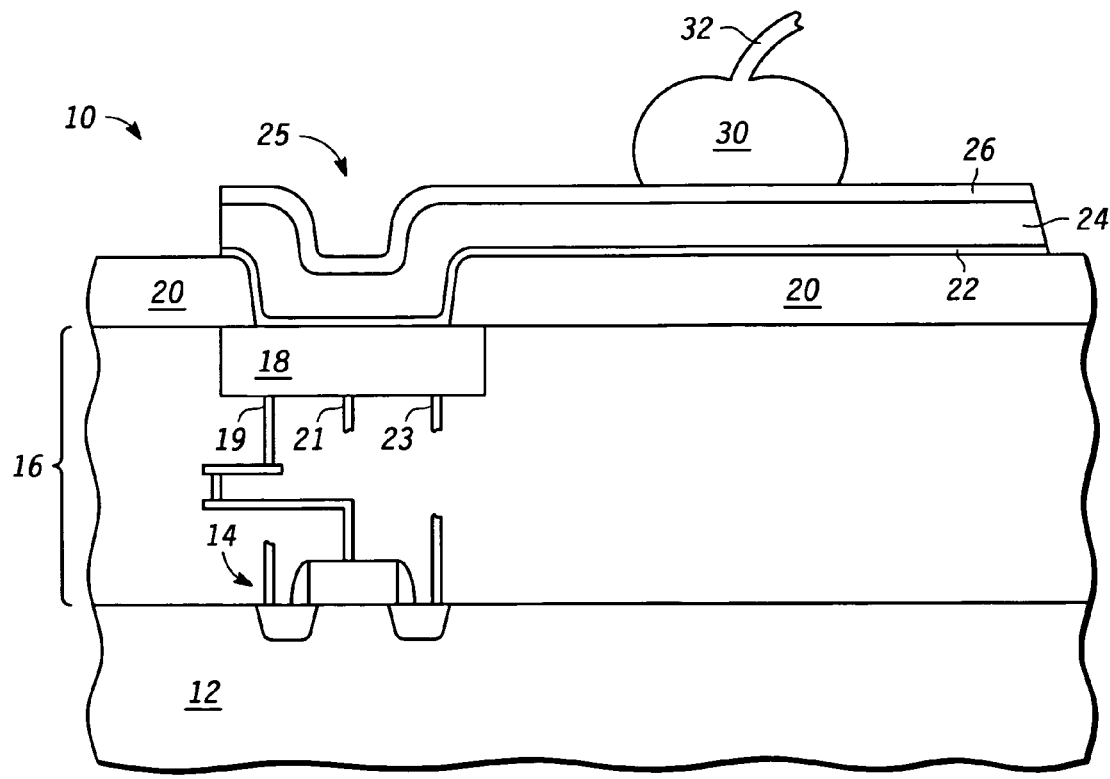
FIG. 2 illustrates in cross-sectional form the bond pad of FIG. 1 with an attached ball bond.

Illustrated in FIG. 2 is further processing of the bond pad 25 of FIG. 1. In the illustrated form a gold ball bond 30 is formed on a predetermined portion of the cap layer 26. Formation of the gold ball bond 30 is by conventional processing wherein ultrasonic and thermal energy is applied to the interface between gold ball 30 and top surface of cap layer 26. The thermosonic energy which is applied to the interface is sufficient to scrub or remove any native aluminum oxide layer resident on cap layer 26 and form a gold aluminum intermetallic. Therefore, the formation of the gold ball bond 30 on cap layer 26 forms a low resistance electrical contact.

It should be understood that other metals may be used to implement the ball bond 30. Other metals include copper and silver and alloys thereof. The gold ball bond 30 may be positioned anywhere laterally along the cap layer 26 including immediately above the final metal portion 18. Regardless of where the gold ball bond 30 is placed, a good electrical connection is made to the cap layer 26 because the cap layer 26 is formed of pure aluminum and is not corroded by processing chemicals used between the step of forming cap layer 26 and forming the gold ball bond 30. It should be understood that the gold ball bond 30 formation is conventional and therefore will not be described in further detail. A conductive wire 32 is then contacted to the gold ball bond 30 for permitting electrical connection from the gold ball bond 30 to a location (not shown) to be determined. The wire 32 usually has the same material as the ball bond and is typically one of pure copper, a copper alloy, pure gold, a gold alloy, pure silver, or a silver alloy where "pure" means at least 98% pure content.

Figure 3:
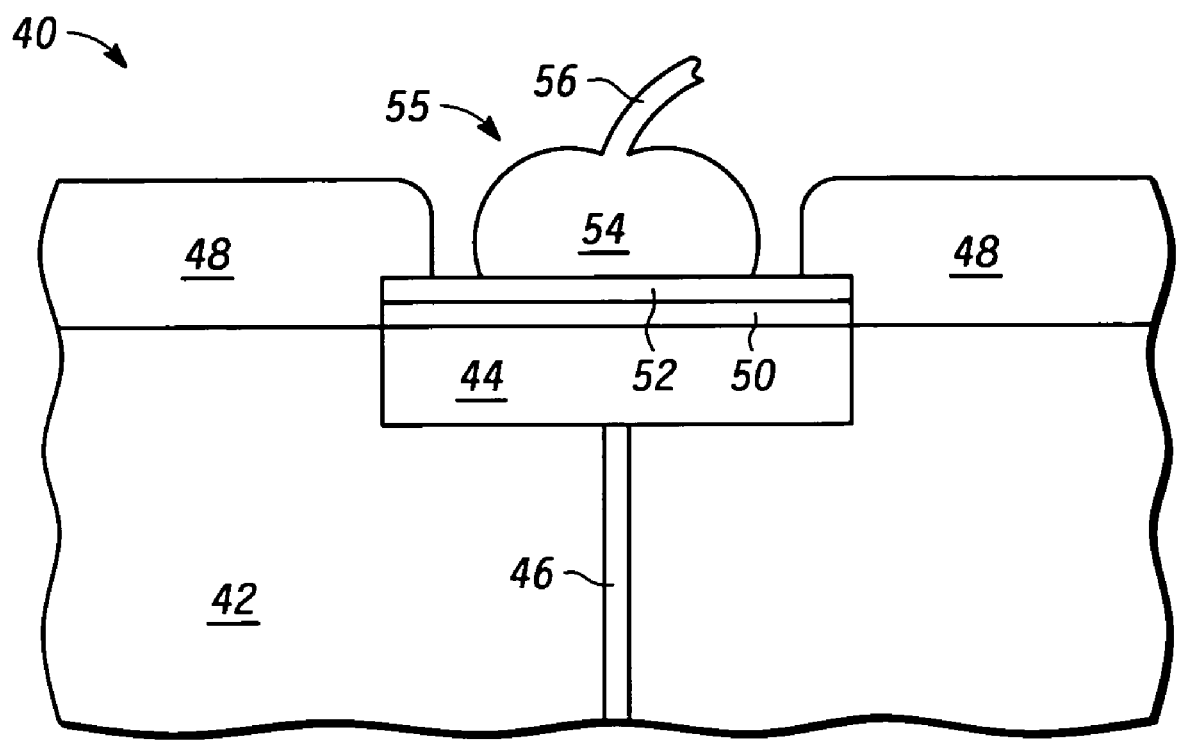
FIG. 3 illustrates in cross-sectional form another form of a bond pad in accordance with the present invention.

Illustrated in FIG. 3 is an alternate embodiment illustrating a semiconductor device 40 having a bond pad 55. In particular, a substrate 42 is provided having an interconnect 46 formed therein. The interconnect 46 is a conductive material such as a metal. The substrate 42 may be formed of silicon, germanium or suitable III-V compound materials, such as Gallium-Arsenide (GaAs). Formed at an upper surface of the substrate 42 is a bond pad 44. In one form the bond pad 44 is either copper, aluminum, a copper alloy or an aluminum alloy. The bond pad 44 is conductive and is an aluminum alloy. In one form the aluminum alloy contains 0.5 percent copper. In another form the aluminum alloy contains 1 percent silicon.

Optionally formed overlying the bond pad 44 is a barrier layer 50. In one form the barrier is formed of one of the following conductive materials: tantalum or titanium. Additionally, a bi-layer structure may be used for barrier layer 50. In a bi-layer implementation, the materials tantalum and tantalum nitride or titanium and titanium nitride are used for the barrier layer 50. The barrier layer 50, when provided, functions to protect the underlying bond pad 44 by preventing any copper or silicon within bond pad 44 from diffusing into any overlying materials that are subsequently formed. Formed overlying the barrier layer 50 is a cap layer 52. The cap layer 52 may be formed directly on the bond pad 44 when the barrier layer 50 is not used. Both barrier layer 50 and cap layer 52 are formed by a blanket deposition, such as sputtering, overlying the substrate 42. Barrier layer 50 and cap layer 52 are patterned to result in the layers as illustrated in FIG. 3. The cap layer 52, in one form, is made of pure aluminum or an aluminum alloy. At this point in the processing a passivation layer 48 is blanket deposited. The passivation layer 48 is an electrically insulating material such as an oxide or a nitride. The passivation layer 48 is patterned to create an opening where the bond pad 55 is formed. Within the opening is exposed a portion of the cap layer 52. At this point in the processing a gold ball bond 54 is formed directly on the exposed cap layer 52. It should be understood that other metals may be used to implement the ball bond 54. The gold ball bond 54 has a wire 56 attached thereto for connecting the bond pad 55 to a point not illustrated.

By now it should be apparent that there has been provided a method for making a semiconductor device having a bond pad. The bond pad does not have corrosion effects created by residual chemicals commonly used during the processing. Therefore, the bond pads disclosed herein are reliable and exhibit minimal yield failures. All bond pads within the die are also consistent in surface integrity.

In one form there is herein provided an electronic device that has a bond pad with a first layer of a first material, the first material including aluminum and copper. A second layer of a second material is over the first layer, the second material comprising aluminum, the second material being essentially free of copper. The second material of the second layer is therefore aluminum-based. In one form the first material includes at least 95% aluminum by weight and less than 1% copper by weight. In another form the second material includes at least 98% aluminum by weight. In another form the second material includes at least one from the group consisting of palladium, nickel, gold, platinum, ruthenium, rhodium, iridium, cerium, and molybdenum. In yet another form the second material is at least 99.9% aluminum by weight. In yet another form the second material includes palladium, wherein the palladium less than 1% by weight. In a further form the electronic device further includes a wire that is bonded to the second layer. In yet another form the wire includes at least 99% gold by weight. In another form the device has at least one transistor including a semiconductor material and an interconnect layer over the at least one transistor. The interconnect layer includes an electrically conductive interconnect, wherein the bond pad is electrically coupled to the conductive interconnect. In yet another form the bond pad includes a barrier layer located between the first layer and the second layer.

In yet another form there is provided a method of forming an electronic device. A first layer of a bond pad is formed, the first layer being of a first material, the first material including aluminum and copper. A second layer of the bond pad is formed over the first layer, the second layer being of a second material, the second material including aluminum, the second material being essentially free of copper. In yet another form the first material includes at least 95% aluminum by weight and less than 1% copper by weight. In yet another form the second material includes at least 98% aluminum by weight. In another form the second material includes at least one from the group consisting of palladium, nickel, gold, platinum, ruthenium, rhodium, iridium, cerium, and molybdenum. In another form the second material is at least 99.9% aluminum by weight. In one form the second material comprises palladium, wherein the palladium is less than 1% by weight. In another form a wire is bonded to the second layer of the bond pad. In yet another form the wire is at least 99% gold by weight. In yet another form a transistor that includes semiconductor material is formed. An interconnect layer is formed over the transistor, the interconnect layer including an electrically conductive interconnect. The bond pad is electrically coupled to the interconnect. In another form the forming of the first layer of the bond pad includes forming a first layer of the first material over a wafer. Forming the second layer of the bond pad includes forming a second layer of the second material over the first layer of the first material over the wafer. Forming the first layer of the bond pad includes patterning the first layer of the first material over the wafer after the forming the second layer of the second material over the first layer of the first material over the wafer. Forming the second layer of the bond pad includes patterning the second layer of the second material over the first layer of the first material over the wafer.

In yet another form there is herein provided a method of forming an electronic device by forming a bond pad, the bond pad including a first layer of a first material, the first material including at least 95% aluminum by weight, and the first material including copper. The bond pad includes a second layer of a second material over the first layer, the second material being of a different composition than the first material. The second material has a composition of one of the following: 1) at least 95% aluminum by weight and including at least one from the group consisting of palladium, nickel, gold, platinum, ruthenium, rhodium, iridium, cerium, and molybdenum; or 2) at least 99.9% aluminum by weight. A wire is bonded to the second layer of the bond pad.

In the foregoing specification, the invention has been described with reference to specific embodiments. However, one of ordinary skill in the art appreciates that various modifications and changes can be made without departing from the scope of the present invention as set forth in the claims below. For example, various widths and heights of the bond pad profile may be created. While the bond pad embodiments described herein may be used in connection with ultra-fine wire bond pitch, the bond pad may be used for a wide range of circuit dimensions.

Accordingly, the specification and figures are to be regarded in an illustrative rather than a restrictive sense, and all such modifications are intended to be included within the scope of the present invention. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. An electronic device comprising:
    a bond pad, the bond pad comprising:
        a metal portion for making electrical contact from above;
        a first conductive layer overlying the metal portion and in contact with the metal portion, the first conductive layer being a barrier by protecting the underlying metal portion from diffusing into overlying materials;
        a second conductive layer of a first material overlying and in contact with the first conductive layer, the first material comprising aluminum and copper; and
        a third conductive layer of a second material over and in contact with the second conductive layer, the second material comprising aluminum and being essentially free of copper, and comprising at least palladium, wherein the palladium is less than 1% by weight; and
        a wire or conductive ball in direct contact with the third conductive layer.

2. The electronic device of claim 1 wherein the first material comprises at least 95% aluminum by weight and less than 1% copper by weight.

3. The electronic device of claim 1 wherein the second material comprises at least 98% aluminum by weight.

4. The electronic device of claim 1 wherein the second material is at least 99.9% aluminum by weight.

5. The electronic device of claim 1 further comprising:
    a substrate;
    a transistor formed within and above the substrate, all of the transistor underlying the metal portion in a lateral direction; and
    one or more interconnect layers overlying the substrate for making electrical contact from the transistor to the metal portion.

6. The electronic device of claim 1 further comprising:
    a substrate;
    a transistor formed within and above the substrate; and
    one or more interconnect layers overlying the substrate for making electrical contact to the transistor, wherein at least one of the one or more interconnect layers comprises the metal portion.

7. The electronic device of claim 6 wherein the wire comprises at least 99% gold by weight.

8. The electronic device of claim 1 further comprising:
    a plurality of interconnect layers underlying the metal portion and comprising a plurality of vias; and
    a transistor comprising a gate connected to one of the plurality of vias.

9. A method of forming an electronic device, the method comprising:
    forming a metal portion for making electrical contact from above;
    forming a first conductive layer overlying the metal portion and in contact with the metal portion, the first conductive layer being a barrier by protecting the underlying metal portion from diffusing into overlying materials;
    forming a second conductive layer of a bond pad, the first layer being of a first material and overlying and being in contact with the first conductive layer, the first material comprising aluminum and copper; and
    forming a third conductive layer of the bond pad over and in contact with the second conductive layer, the third conductive layer being of a second material, the second material comprising aluminum, the second material being essentially free of copper and comprising at least palladium, wherein the palladium is less than 1% by weight.

10. The method of claim 9 wherein the first material comprises at least 95% aluminum by weight and less than 1% copper by weight.

11. The method of claim 10 wherein the second material comprises at least 98% aluminum by weight.

12. The method of claim 10 wherein the second material is at least 99.9% aluminum by weight.

13. The method of claim 10 further comprising:
    providing a substrate;
    forming a transistor within and above the substrate;
    forming one or more interconnect layers overlying the substrate for making electrical contact to the transistor, wherein at least one of the one or more interconnect layers comprises the metal portion; and
    bonding a wire to the conductive layer of the bond pad.

14. The method of claim 13 wherein the wire is at least 99% gold by weight.

15. The method of claim 9 further comprising:
    providing a substrate;
    forming a transistor within and above the substrate, all of the transistor underlying the metal portion in a lateral direction; and forming one or more interconnect layers overlying the substrate for electrically contacting the transistor to the metal portion.

16. The method of claim 9 further comprising:

forming a transistor comprising a semiconductor material; and forming an interconnect layer over the transistor, the interconnect layer comprising an electrically conductive interconnect having a plurality of vias;

wherein the bond pad is electrically coupled to the electrically conductive interconnect.

17. The method of claim 9 wherein:

the forming the first conductive layer of the bond pad comprises forming the first conductive layer over a wafer;

the forming the second conductive layer of the bond pad comprises forming a second conductive layer of the first material over the wafer;

the forming the third conductive layer of the bond pad comprises forming a third conductive layer of the second material over the second conductive layer of the first material over the wafer;

the forming the first conductive layer of the bond pad comprises patterning the first conductive layer over the wafer after the forming the second and the third conductive layers over the wafer;

the forming the second conductive layer of the bond pad comprises patterning the second conductive layer of the first material over the wafer after the forming the third conductive layer of the second material over the second conductive layer of the first material over the wafer; and the forming the third conductive layer of the bond pad comprises patterning the third conductive layer of the second material over the second conductive layer of the first material over the wafer.

18. A method of forming an electronic device comprising:

forming a bond pad, the bond pad comprising a metal portion for making electrical contact from above, a conductive barrier layer overlying the metal portion for preventing the metal portion from diffusing into overlying materials, a first layer of a first material, the first material comprising at least 95% aluminum by weight, the first material comprising copper, the bond pad comprising a second layer of a second material over the first layer, the second material is of a different composition than the first material, the second material having a composition of:

1) at least 95% aluminum by weight and comprising at least palladium in less than 1% by weight;

bonding a wire to the second layer of the bond pad; and forming a transistor underlying the bond pad, all of the transistor underlying the metal portion in a lateral direction.

* * * * *